United States Patent [19]

Cerny, Jr. et al.

[11] 4,369,522

[45] Jan. 18, 1983

[54] SINGLY-BALANCED ACTIVE MIXER CIRCUIT

[75] Inventors: Frank J. Cerny, Jr., North Riverside; George D. Helm, Cary; Ronald G. Wesoloski, Glenview, all of Ill.

[73] Assignee: Motorola, Inc., Schaumburg, Ill.

[21] Appl. No.: 70,955

[22] Filed: Aug. 30, 1979

Related U.S. Application Data

[62] Division of Ser. No. 921,675, Jul. 3, 1978, Pat. No. 4,193,036.

[51] Int. Cl.$^3$ .............................................. H04B 1/26
[52] U.S. Cl. .................................................... 455/333
[58] Field of Search ............... 455/313, 323, 326, 327, 455/330–333; 332/24, 43 R, 43 B

[56] References Cited

U.S. PATENT DOCUMENTS

| | | | |
|---|---|---|---|
| 2,538,715 | 1/1951 | Weel | 455/332 |
| 3,469,212 | 9/1969 | Karl et al. | 332/43 B |
| 3,614,668 | 10/1971 | Sudoh | 332/43 B |
| 3,624,506 | 3/1970 | Townsend | 455/332 |
| 3,727,078 | 4/1973 | Wollesen | 455/332 |

Primary Examiner—Jin F. Ng
Attorney, Agent, or Firm—Rolland R. Hackbart; James W. Gillman

[57] ABSTRACT

A singly-balanced active mixer circuit is disclosed for developing an IF signal by combining an RF signal and a local oscillator (LO) signal. The RF and LO signals are applied to a strip transmission line ring which provides balanced components of the LO signal to a pair of active devices arranged in an singly-balanced active mixer. The active devices are coupled directly, or via a balanced PI-network to the primary winding of an output transformer for application to the following IF stage of the radio receiver. DC biasing of the active devices is provided via a floating tap on the primary winding of the output transformer which is not by-passed at the input, LO and IF frequencies. The singly balanced active mixer circuit may be advantageously utilized in a radio having a receiver with broadband front-end RF selectivity.

10 Claims, 5 Drawing Figures

SINGLY-BALANCED ACTIVE MIXER CIRCUIT

This is a division of application Ser. No. 921,675, filed July 3, 1978, now U.S. Pat. No. 4,193,036 issued Mar. 11, 1980.

TECHNICAL FIELD

The present invention relates to radio mixer circuits, and more particularly, to a balanced active mixer circuit for use in radios having receivers with broadband front-end selectivity.

BACKGROUND ART

Singly-balanced passive mixers have been used in prior art microwave systems where a pair of mixer diodes has been symmetrically fed by balanced components of a local oscillator signal. The coupling of the microwave signal and the local oscillator signal to the mixer diodes has been accomplished by a hybrid circuit ring. Such a microwave system is described in U.S. Pat. No. 3,659,206. However, since balanced passive mixers have a 6 to 8 dB conversion loss, the balanced passive mixer must be preceded by an expensive RF amplifier.

The RF amplifier may be eliminated by utilizing active devices such as field effect transistors or bipolar transistors in place of the passive devices. Singly balanced active mixers are described in U.S. Pat. No. 3,831,097 and in application note AN72-1 by Ed Oxner, published by Siliconix Inc., 1976. However, prior art singly balanced active mixers have typically utilized toroidal transformers for coupling the LO signal to the active devices and an output transformer that is grounded at the center of the primary winding. The grounding of the output transformer is thought to be a critical factor in establishing good mixer balance, which is necessary for rejection of spurious signals. Therefore, in order to be highly immune to IF related spurius signals, prior art balanced active mixers would be costly and complex due to critical design considerations in the design of the circuitry coupling the local oscillator signal to the active devices and in maintaining balance in the output transformer to the following intermediate frequency stage.

SUMMARY OF THE INVENTION

Accordingly, it is a general object of the present invention to provide an improved and inexpensive singly-balanced active mixer circuit for use in radios having a receiver with broadband front-end RF selectivity.

It is a further object of the present invention to provide an improved singly-balanced active mixer circuit for use in broadband radios where it is necessary to highly attenuates mixer spurious products due to the one-half IF spurious frequency.

In practicing the invention, a singly-balanced active mixer combines a radio frequency (RF) signal with a local oscillator (LO) signal comprised of two substantially equal components phase shifted by 180 degrees with respect to one another to provide an intermediate frequency (IF) signal. The mixer includes first and second active devices, each coupled to the RF signal and a differently phased component of the LO signal for providing first and second mixer output signals, respectively, an output transformer having an unbypassed center-tapped primary winding with the opposite ends coupled to the first and second mixer output signals for providing a composite IF signal across the secondary winding of the transformer, and a DC biasing network coupled to the center tap of the transformer primary winding for biasing the first and second active devices. The floating center tap of the transformer primary winding is not bypassed to ground at the RF, LO, and IF frequencies. The desired IF components of the first and second mixer signals add in-phase in the primary winding of the output transformer, and the composite IF signal is provided across the secondary winding of the output transformer. The mixer may be advantageously utilized in a broadband radio receiver where it is necessary to attenuate one-half IF spurious products.

DETAILED DESCRIPTION OF THE INVENTION

Figure 1:
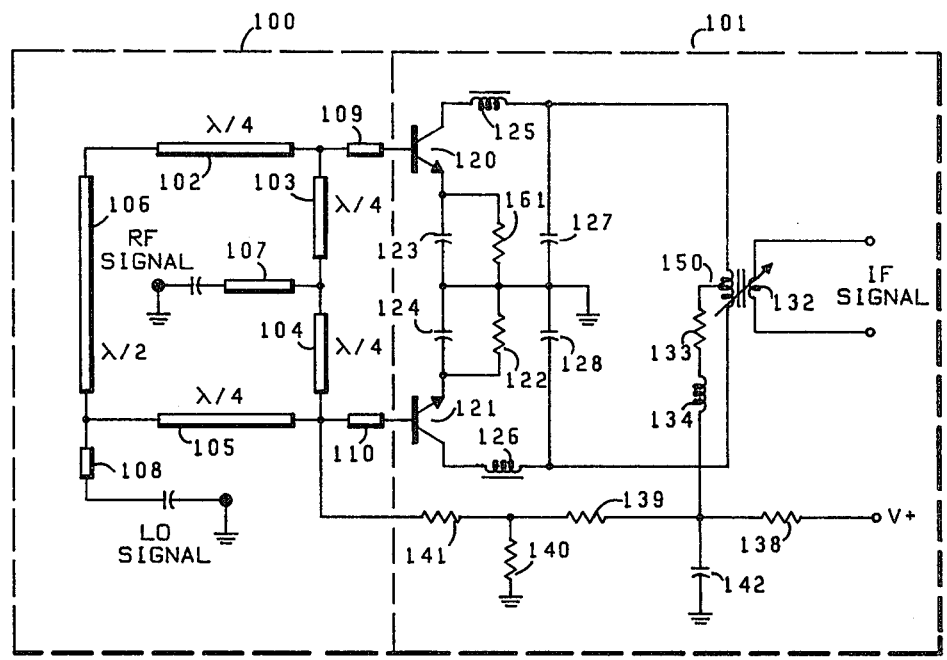
FIG. 1 illustrates a circuit diagram of a balanced active mixer circuit embodying the present invention.

In FIG. 1, there is illustrated a singly-balanced active mixer circuit advantageously adapted for use in an FM radio operative on a plurality of radio channels at relatively high frequencies, for example, frequencies in the 800 MHz range. The radio receiver has a broadband front-end RF selectivity. The receiver bandwidth may approach one-half of the IF, where normally receiver bandwidths are very narrow, being less than one-fourth of the IF. For example, a radio operative at frequencies in the 800 MHz range may have an IF of 45 MHz and a 3 dB RF front-end receiver bandwidth of 20 MHz. Thus the receiver bandwidth of 20 MHz is approximately one-half of the IF, or 22.5 MHz. The one-half IF spurious signal will be a serious problem when operating on receiver channels located near the top end of the receiver RF bandwidth in this application unless the receiver mixer is highly immune to IF related spurious signals. The balanced active mixer circuit of the present invention provides for over 70 dB of attenuation to the one-half IF spurious signal referred to 20 dB quieting sensitivity.

The balanced active mixer circuit includes a strip transmission line ring 100 and a balanced active mixer 101. The strip transmission line ring 100 consists of four one-quarter wavelength segments 102–105 and one one-half wavelength segment 106. The received RF signal is applied via a matching segment 107 to the common junction of segments 103 and 104. The LO signal is applied via matching segment 108 to the common junction of segments 105 and 106. The RF signal splits equally at the junction of segments 103 and 104 and travels around the transmission line ring 100 a total of one-half wavelength via segments 104 and 105, and a total of one wavelength via segments 103, 102 and 106 to the input junction of the LO signal, where the equal portions of the RF signal cancel since they are 180° out of phase. In a similar manner, the LO signal divides into equal portions at the junction of segments 105 and 106, which cancel at the input junction of the RF signal for the same reasons.

In addition, the equal portions of the RF signal are applied in phase with one another to transistors 120 and 121 via segments 103 and 104 and matching segments 109 and 110, respectively. However, equal portions of the LO signal are applied 180° out of phase with respect to one another to the transistors 120 and 121.

Figure 3:
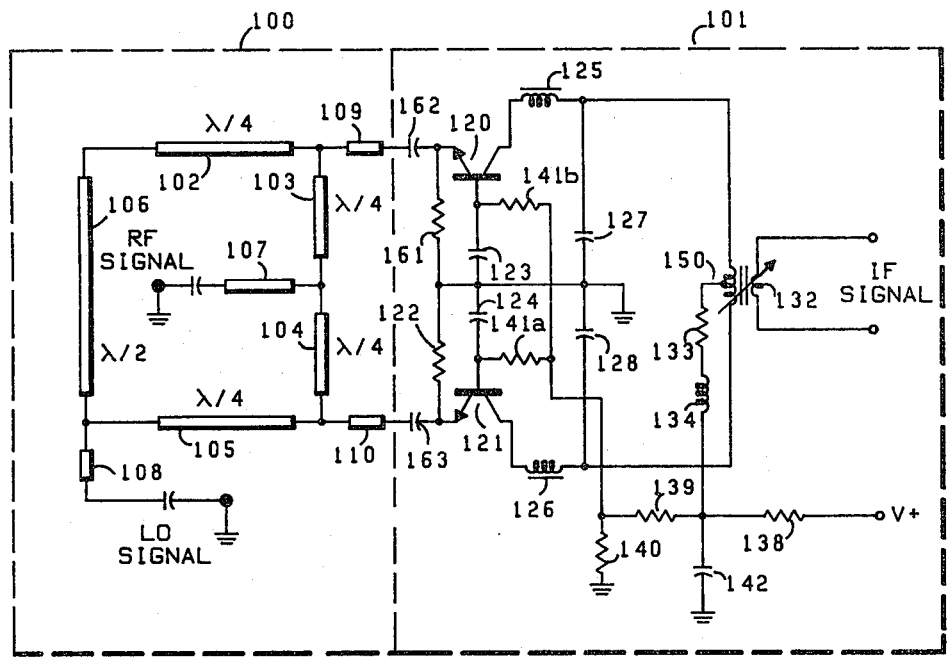
FIG. 3 illustrates another embodiment of the balanced active mixer circuit of FIG. 1, where the bipolar transistors are connected in a common-base configuration.

The bipolar transistors 120 and 121 may be any suitable commercially available transistor, such as the Motorola MRF901. The bipolar transistors 120 and 121 are connected in a common-emitter configuration, although any other suitable configuration such as common-base may be used (see FIG. 3). The emitters of bipolar transistors 120 and 121 are connected to biasing resistors 121 and 122 and capacitors 123 and 124, respectively, for bypassing the RF signal and LO signal. The collectors of bipolar transistors 120 and 121 are connected via series ferrite chokes 125 and 126 to capacitors 127 and 128 and to the output reference transformer 132. The ferrite chokes 125 and 126 may be one-half turn beads which are provided in series with the collectors of the bipolar transistors 120 and 121 to prevent spurious oscillations, or they may be omitted.

A four-to-one ratio ferrite transformer may be used as the output transformer 132. The transformer 132 transforms a balanced input to an unbalanced output, and may have two turns in the secondary winding. The secondary winding may be connected to the first IF stage of the radio receiver. A DC voltage +V is coupled to the primary of the transformer 132 for providing the proper collector bias for transistors 120 and 121. The DC voltage +V is connected via resistor 138 to capacitor 142 and resistor 139. The collector bias voltage to transistors 120 and 121 is provided via choke 134 and resistor 133 to the center tap of the primary winding of transformer 132. By applying the bias voltage through an RF isolating choke at the center tap of transformer 132, instead of RF bypassing the center tap as in the prior art, the precise location of the center tap of transformer 132 is not highly critical to the operation of the balanced active mixer. Since the specifications of the transformer 132 may be relaxed, a much less expensive transformer may now be used. Furthermore, the tap on the primary winding of transformer may be located at any suitable location on the primary winding since the tap is floating at the intermediate frequency instead of being bypassed to ground.

The bias voltage for the bases of transistors 120 and 121 is provided by a resistor divider formed by resistors 139 and 140. The base bias voltage is applied via resistor 141 to the junction of segments 104, 105 and 110 and by way of the continuity provided by segment 110 to the base of transistor 121 and by segments 104, 103 and 109 to the base of transistor 120. This bias may be applied at any segment junction since its placement is not critical.

The singly-balanced active mixer circuit is advantageously adapted for use in any radio having a receiver with broadband front-end RF selectivity. In particular, when such radios have a receiver bandwidth that approaches one-half of the intermediate frequency, interference due to IF-related spurious frequencies may be encountered. However, interference due to the one-half IF spurious signal will be greatly attenuated by utilizing a balanced active mixer circuit embodying the present invention. The theoretical basis for the cancellation of the one-half IF spurious signal can be explained by the following equations by considering the collector currents of transistors 120 and 121. The equations are modelled after the FET drain current equations in U.S. Pat. No. 3,716,730.

The forward transfer characteristic of a bipolar transistor may be expressed by the admittance or y-parameters of the device. This forward transfer admittance may be represented by a Taylor's series since the device is not linear over large input voltage variations. Let $$i_c = Y_0 + Y_1 v_b + Y_2 v_b^2 + Y_3 v_b^3 + \cdots + Y_n v_b^n \quad (1)$$

wherein:
$i_c$ = instantaneous collector current
$v_b$ = instantaneous base-to-emitter voltage Once a quiescent operating point is chosen for the transistor by applying a forward d.c. bias voltage, the Taylor's series may be expanded about this bias point.

$$i_c = y_0 v_{dc} + y_1 v_b' + y_2 v_b'^2 + y_3 v_b'^3 + \cdots + y_n v_b'^n \quad (2)$$

wherein:

$v_b' = v_s + v_o$
$v_s = V_s \cos w_s t$ = desired input voltage at $w_s$
$v_o = V_o \cos w_o t$ = local oscillator voltage at $w_o$
$v_{dc}$ = the d.c. base forward biasing voltage.

In equation 2 above, $y_0$, $y_2$, $y_2$, -are the Taylor's series coefficients for the forward transfer admittance expanded about the quiescent bias point. The "$y_0 v_{dc}$" term is the quiescent d.c. collector current without local oscillator injection. All other even y coefficients will contribute to the operating d.c. current.

The IF frequency, $w_{IF}$, is expressed as $$w_{IF} = |W_s - W_o|$$

The desired output of each mixer device, $i_{c1}$ and $i_{c2}$, in response to an on-channel desired signal, $v_s$ is:

$$c_{c1} = y_2(v_s + v_o)^2 + y_4(v_s + v_o)^4 + - \quad (3)$$

$$i_{c2} = y_2(v_s - v_o)^2 + y_4(v_s - v_o)^4 + -$$

since the local oscillator signal is 180° out of phase at the second mixer.

The current, $i_o$, in the secondary of the output transformer 132 will be proportional to the difference of the above collector currents:

$$i_o = i_{c1} - i_{c2} = y_2[(v_s+v_o)^2 - (v_s-v_o)^2] + y_4[(v_s+v_o)^4 - (v_s-v_o)^4] + - \quad (4)$$

Equation 4 may be simplified to:

$$i_o = 2V_s V_o[y_2 + 3/2 y_4(V_s^2 + V_o^2) + -] \cos |w_s - w_o| t \quad (5)$$

This equation provides the desired output product at the intermediate frequency to a desired input signal at frequency $w_s$.

The undesired "IF spurious responses" such as the half-IF spur are produced by the higher even orders of the transfer function coefficients, $y_n$. The fourth-order coefficient, $y_4$, is the term primarily responsible for the half-IF spur. Such a spurious response will occur at a frequency of $w_r$ when $$2w_r - 2w_o = w_s - w_o. \quad (6)$$

Since $$W_{IF} = |W_s - W_o|$$

equation 6 may be reduced to $$|W_r - W_o| = W_{IF}/2, \quad (7)$$

and the spurious half-IF response will occur at a frequency midway between the frequency of the desired signal and the frequency of the local oscillator.

The undesired output of each mixer device in response to a spurious signal at a frequency of $w_r$ is given by:

$$i_{c1} = y_4(v_r + v_o)^4 + y_6(v_r + v_o)^6 + - \quad (8)$$

$$i_{c2} = y_4(v_r - v_o)^4 + y_6(v_r - v_o)^6 + - \quad (9)$$

These two equations may be simplified to the following equations by retaining only the relevant terms:

$$i_{c1} = [\tfrac{3}{2}y_4 + 15/8 y_6(V_r^2 + V_o^2) + -]V_r^2 V_o^2 \cos|2w_r - 2w_o|t \quad (10)$$

$$i_{c2} = [\tfrac{3}{2}y_4 - 15/8 y_6(V_r^2 + V_o^2) + -]V_r^2 V_o^2 \cos|2w_r - 2w_o|t \quad (11)$$

The current in the secondary of the output transformer 132 will be proportional to the difference of the above collector currents:

$$i_o = i_{c1} - i_{c2} = [15/4 y_6(V_r^2 + V_o^2) + -]V_r^2 V_o^2 \cos|2w_r - 2w_o|t. \quad (12)$$

By using the singly-balanced mixer configuration the terms produced by the fourth-order nonlinearity of the transfer function completely cancel, but secondary products produced by higher order nonlinearities such as $y_6$ and $y_{10}$ still remain. Since these higher order coefficients are much smaller, the response to a signal near a frequency of $w_r$ will be greatly reduced by using the singly-balanced configuration as shown hereinabove.

For example, a particular radio channel may have a transmitter frequency of 835 MHz and a receiver frequency of 880 MHz. The LO signal for this duplex radio channel may be 835 MHz and the IF frequency may be 45 MHz. Due to fourth order mixing products between the LO signal of 835 MHz and a spurious signal of 857.5 MHz, a signal will be produced at the IF frequency of 45 MHz. However, since the two mixer collector currents are phased by 180° with respect to one another, the fourth order mixing products essentially cancel at the primary of the transformer 132, as demonstrated hereinabove. Thus, the one-half IF spurious signal is greatly attenuated by the balanced active mixer circuit of the present invention. If the transformer 132 is bypassed to ground at the center tap of the primary winding as in the prior art, the placement of the center tap of the primary winding is very critical to the balance of the balanced active mixer. Thus, imprecise positioning of the tap on the winding of the transformer 132 will degrade the spurious signal rejection of the prior art balanced mixers. However, the position of the tap on the primary winding of the transformer 132 is not critical in the balanced active mixer circuit of the present invention, since the tap of the primary winding is not bypassed to ground for the IF signal currents.

Figure 2:
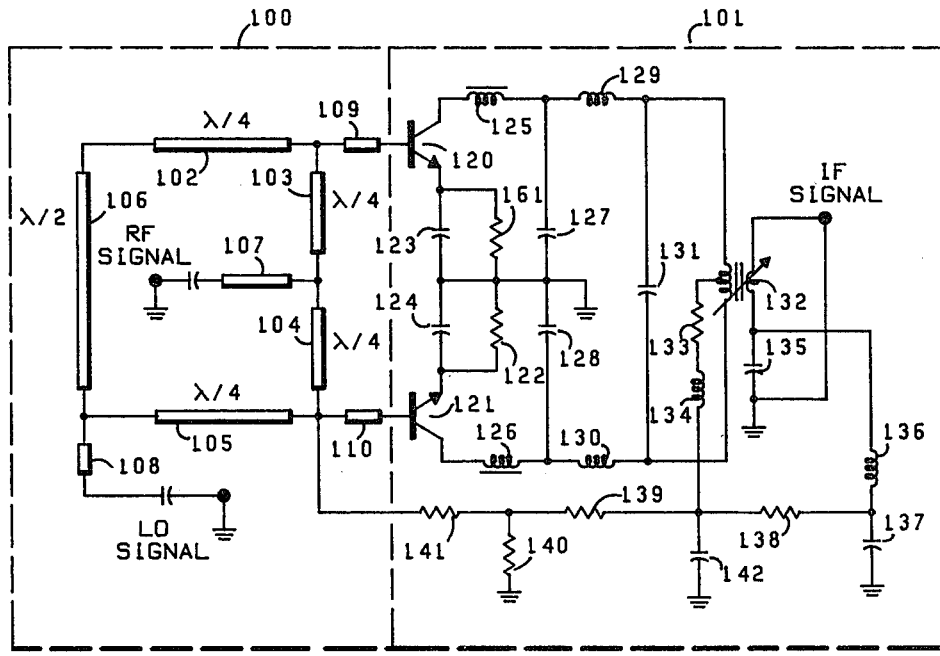
FIG. 2 illustrates an embodiment of the balanced active mixer circuit of FIG. 1 adapted for use in a mobile radio.

In FIG. 2 there is illustrated another embodiment of the balanced active mixer circuit of the present invention. Components of FIG. 2 corresponding to those of FIG. 1 are designated by the same reference number. The balanced active mixer circuit of FIG. 2 is essentially the same as the balanced active mixer circuit of FIG. 1 except for inclusion of a balanced PI network 129-131 between the chokes 125 and 126 and the output transformer 132, and additional circuit elements 135, 136 and 137 in the DC biasing network. The PI network provides impedance matching between the transistors and the following IF stage, and filtering centered about the intermediate frequency. The connection of the IF signal to the following IF stage also provides for connection to a DC voltage source +V for the DC biasing network. The DC voltage +V is present across capacitor 135 and is coupled to resistor 138 via choke 136 and capacitor 137. Thus, only one cable is necessary to connect both the IF signal and the DC voltage +V.

Figure 4:
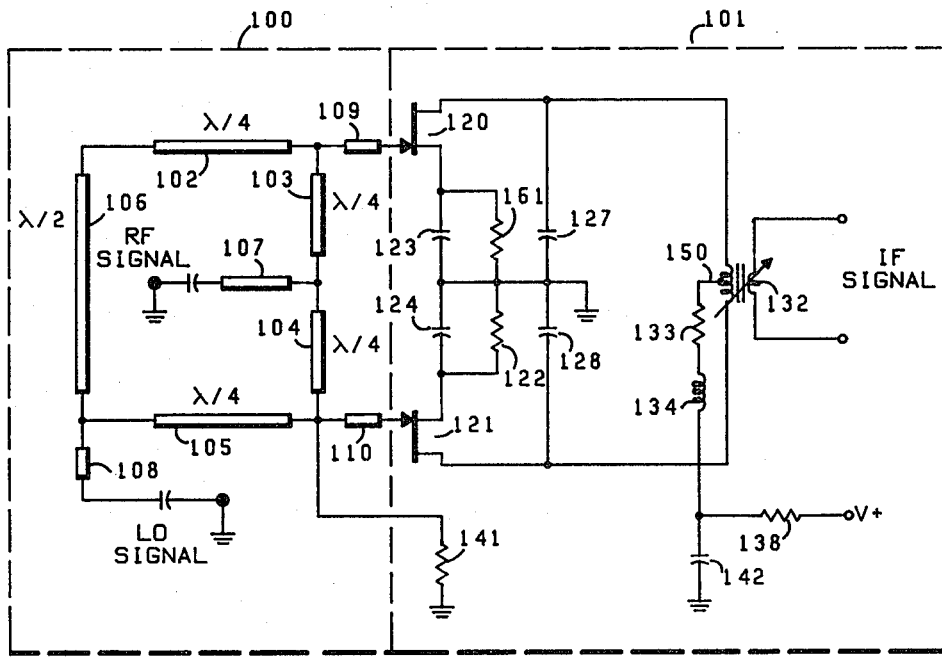
FIG. 4 illustrates still another embodiment of the balanced active mixer circuit of FIG. 1, where the bipolar transistors are replaced with FET devices in a common-source configuration.
Figure 5:
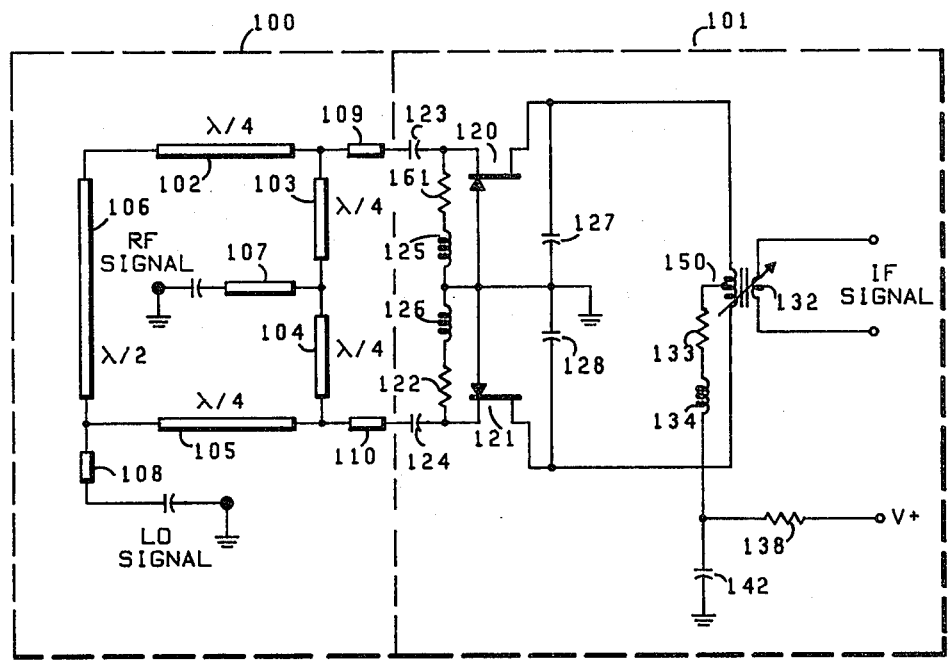
FIG. 5 illustrates yet another embodiment of the balanced active mixer circuit of FIG. 1, where the bipolar transistors are replaced with FET devices in a common-gate configuration.

The improved balancing feature of the transformer coupling to the following IF stage may be advantageously utilized in any suitable singly-balanced active mixer circuit. Furthermore, the active devices of the balanced active mixer circuit of the present invention may be FET devices or any other suitable active devices (see FIGS. 4 and 5).

We claim:

1. A singly-balanced active mixer for developing an intermediate frequency (IF) signal from a radio frequency (RF) signal and a local oscillator (LO) signal, the local oscillator signal being comprised of two substantially equal components phase shifted by 180 degrees with respect to one another, said mixer comprising:
   (a) first and second bipolar transistor devices each having an emitter, base and collector and arranged in a common-emitter configuration, the base of the first device coupled to the RF signal and to one of the LO signals for providing a first mixer signal, and the base of the second device coupled to the RF signal and to the other one of the LO signals for providing a second mixer signal;
   (b) a first DC biasing network coupled to the emitters of the first and second devices for applying a predetermined bias voltage hereto;
   (c) a second DC biasing network coupled to the bases of the first and second devices for applying a predetermined bias voltage thereto;
   (d) an output transformer having a tap at a predetermined location on the primary winding, said tap not being bypassed at the RF, LO and IF frequencies, the first and second mixer signals from the first and second devices coupled to opposite ends of the primary winding, IF components of the first and second mixer signals adding in phase in the primary winding, and the composite IF signal provided across the secondary winding of said output transformer; and
   (e) a third DC biasing network coupled to said tap of the primary winding of the output transformer for applying a predetermined bias voltage to the collectors of the first and second devices.

2. The mixer according to claim 1 wherein a choke is interposed between the third DC biasing network and said tap of the output transformer for isolating the tap on the primary winding of the output transformer from the third DC biasing network at the RF, LO and IF frequencies.

3. The mixer according to claim 2, further including a balanced PI-network interposed between the first and second devices and the output transformer, the balanced PI-network selectively tuned to pass the IF signal.

4. The mixer according to claim 3, wherein the output transformer is a ferrite transformer having a center-tapped primary winding and a primary-to-secondary winding turns ratio of four to one.

5. The mixer according to claim 3 further including first and second chokes interposed between the first and second devices and the output transformer, respectively, for preventing spurious oscillations in the first and second devices.

6. A singly-balanced active mixer for developing an intermediate frequency (IF) signal from a radio frequency (RF) signal and a local oscillator (LO) signal, the local oscillator signal being comprised of two substantially equal components phase shifted by 180 degrees with respect to one another, said mixer comprising:

(a) first and second bipolar transistor devices arranged in a common-base configuration, the emitter of the first device coupled to the RF signal and to one of the LO signals for providing a first mixer signal, and the emitter of the second device coupled to the RF signal and to the other one of the LO signals for providing a second mixer signal;

(b) a first DC biasing network coupled to the emitters of the first and second devices for applying a predetermined bias voltage thereto;

(c) a second DC biasing network coupled to the bases of the first and second devices for applying a predetermined bias voltage thereto;

(d) an output transformer having a tap at a predetermined location on the primary winding, said tap not being bypassed at the RF, LO and IF frequencies, the first and second mixer signals from the first and second devices coupled to opposite ends of the primary winding, IF components of the first and second mixer signals adding in phase in the primary winding, and the composite IF signal provided across the secondary winding of said output transformer; and (e) a third DC biasing network coupled to said tap of the primary winding of the output transformer for applying a predetermined bias voltage to the collectors of the first and second devices.

7. The mixer according to claim 6, wherein a choke is interposed between the third DC biasing network and said tap of the output transformer for isolating the tap on the primary winding of the output transformer from the third DC biasing network at the RF, LO and IF frequencies.

8. The mixer according to claim 7, further including a balanced PI-network interposed between the first and second devices and the output transformer, the balanced PI-network selectively tuned to pass the IF signal.

9. The mixer according to claim 8, wherein the output transformer is a ferrite transformer having a center-tapped primary winding and a primary-to-secondary winding turns ratio of four-to-one.

10. The mixer according to claim 8, further including first and second chokes interposed between the first and second devices and the output transformer, respectively, for preventing spurious oscillations in the first and second devices.

* * * * *

UNITED STATES PATENT AND TRADEMARK OFFICE
CERTIFICATE OF CORRECTION

PATENT NO. : 4,369,522
DATED : January 18, 1983
INVENTOR(S) : Frank J. Cerny, Jr.

It is certified that error appears in the above—identified patent and that said Letters Patent is hereby corrected as shown below:

Delete from "Inventors" on first page:

--George D. Helm, Cary; Ronald G. Wesoloski, Glenview, all--

Signed and Sealed this

Fifth Day of July 1983

[SEAL]

Attest:

Attesting Officer

GERALD J. MOSSINGHOFF

Commissioner of Patents and Trademarks